(12) United States Patent
Priel et al.

(10) Patent No.: US 7,940,084 B2
(45) Date of Patent: May 10, 2011

(54) DEVICE AND METHOD FOR SHARING CHARGE

(75) Inventors: Michael Priel, Hertzelia (IL); Dan Kuzman, Givat Shmuel (IL); Eitan Zmora, Jerusalem (IL)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/593,519

(22) PCT Filed: Apr. 5, 2007

(86) PCT No.: PCT/IB2007/051234
§ 371 (c)(1),
(2), (4) Date: Sep. 28, 2009

(87) PCT Pub. No.: WO2008/122840
PCT Pub. Date: Oct. 16, 2008

(65) Prior Publication Data
US 2010/0045363 A1    Feb. 25, 2010

(51) Int. Cl.
*H03K 19/0175* (2006.01)
(52) U.S. Cl. .................................. 326/82; 326/86

(58) Field of Classification Search .............. 326/82–87; 327/530
See application file for complete search history.

(56) References Cited

U.S. PATENT DOCUMENTS

| | | | |
|---|---|---|---|
| 5,528,541 A | 6/1996 | Ghia et al. | |
| 5,574,633 A * | 11/1996 | Prater | 363/59 |
| 5,740,000 A | 4/1998 | Stackhouse et al. | |
| 6,356,115 B1 | 3/2002 | Dabral et al. | |
| 2006/0284639 A1* | 12/2006 | Reynolds | 324/765 |
| 2007/0176609 A1* | 8/2007 | Ely et al. | 324/678 |

OTHER PUBLICATIONS

International Search Report and Written Opinion correlating to PCT/IB2007/051234 dated Dec. 13, 2007.

* cited by examiner

*Primary Examiner* — Rexford N Barnie
*Assistant Examiner* — Thienvu V Tran

(57) ABSTRACT

A method for sharing charge between IO circuits, the method includes providing an integrated circuit that comprises multiple IO circuits, each comprising an IO pad. The method is characterized by including: determining to share a charge between multiple IO circuits; and sharing charge between the multiple IO circuits by coupling the multiple IO circuits to a shared circuit that is characterized by a state that reflects multiple iterations of sharing charge operations.

19 Claims, 6 Drawing Sheets

US 7,940,084 B2

DEVICE AND METHOD FOR SHARING CHARGE

FIELD OF THE INVENTION

The present invention relates to devices and methods for sharing charge and especially for sharing charge between IO circuits.

BACKGROUND OF THE INVENTION

Modern integrated circuits are expected to operate at very high frequencies. Integrated circuits interface with other components via input/output (IO) pads. IO circuits that include IO pads are also expected to operate at very high frequencies while driving relatively high loads. It is known that fast state changes of IO circuits are power consuming.

There is a growing need to activate IO circuits with a reduced power penalty.

SUMMARY OF THE PRESENT INVENTION

A device and a method for sharing charge, as described in the accompanying claims.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

The following figures illustrate exemplary embodiments of the invention. They are not intended to limit the scope of the invention but rather assist in understanding some of the embodiments of the invention. It is further noted that all the figures are out of scale.

A method and apparatus for sharing charge among multiple IO circuits is described below. In the following description, for purposes of explanation, numerous specific details are set forth in order to provide a thorough understanding of the present invention. It will be evident, however, to one skilled in the art that the present invention may be practiced without these specific details.

Various operations will be described as multiple discrete operations performed in turn in a manner that is most helpful in understanding the present invention. However, the order of description should not be construed as to imply that these operations are necessarily performed in the order that they are presented, or even order dependent.

In addition, repeated usage of the phrases "according to an embodiment" or "conveniently" does not necessarily refer to the same embodiment, although it may.

While in the description below the invention is described in relation to bi-directional IO circuits, there is nothing to prevent the invention from being practiced in unidirectional IO circuits such as input circuits or output circuits.

Figure 1:
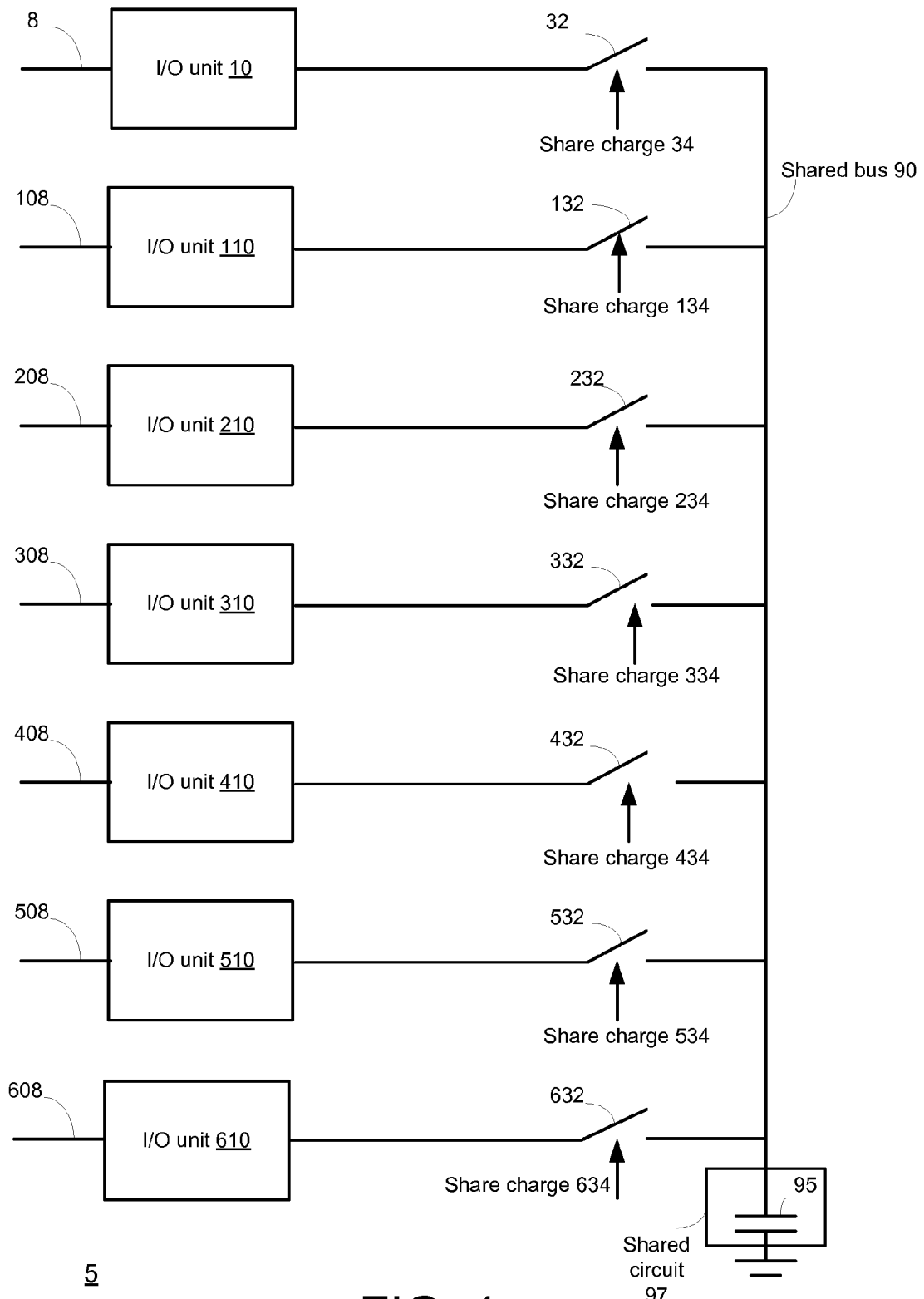
FIG. 1 illustrates a device, according to an embodiment of the invention.

FIG. 1 illustrates device 5, according to an embodiment of the invention.

Device 5 can be a mobile device (such as but not limited to a cellular phone, a personal data accessory, a media player, a laptop computer, a palm computer) or a stationary device (such as but not limited to a desktop computer, a server, a network node, a base station).

Device 5 includes an integrated circuit that in turn includes multiple IO circuits, each including an IO pad. The IO circuits of device 5 can form one or more groups of IO pads. Each group of IO pads can be selectively connected to the same shared circuit. A single IO group can include a large number of IO pads.

For example, an IO group can include more than four IO circuits, more than ten IO circuits, more than forty IO circuits and even more than one hundred IO circuits. An IO group can include IO circuits that are relatively proximate to each other but this is not necessarily so.

Device 5 can select, at each charge sharing cycle, the multiple IO circuits (out of a group of IO circuits) that will participate in that charge sharing cycle. Conveniently, before IO circuits (of a group of IO circuits) are requested perform an IO operation (to participate at an IO cycle), the device selects the multiple IO circuits that will share charge with a shared circuit.

Conveniently, IO circuits that are expected to alter their state during the next IO cycle (for example form a high level state to a low level state or from a low level state to a high level state) will be selected. A state of an IO circuit can reflects its voltage level, is charge level, its current level and the like.

Typically, IO circuits that are not expected to alter their state during the next IO cycle (remain at high level state or remain at low level state) or IO circuits that are placed in high impedance state (or otherwise a virtually disconnected state) do not share charge during the charge sharing cycle.

Accordingly, the number and identity of IO circuits that participate at a charge sharing cycle can vary from one charge sharing cycle to another.

According to an embodiment of the invention a group of IO circuits can be potentially connected to the same shared circuit via a shared bus.

While device 5 includes the aforementioned components, it is apparent that the present invention should not be limited to devices having such components.

Device 5 includes integrated circuit 7 that in turn include a group of IO circuits, such as IO circuits 10, 110, 210, 310, 410, 510 and 610 that are connected between data lines 8, 108, 210, 308, 408, 508 and 608 and between switches 32, 132, 232, 332, 432, 532 and 632 accordingly. Switches 32, 132, 232, 332, 432, 532 and 632 form a switching circuitry that can selectively connect one or more IO circuits to shared bus 90. Shared bus 90 is also connected to shared circuit 97 that is illustrated as including a capacitor 95. Each switch can be controlled by a dedicated signal such as share charge signal 34, 134, 234, 334, 434, 534 and 623.

Figure 2:
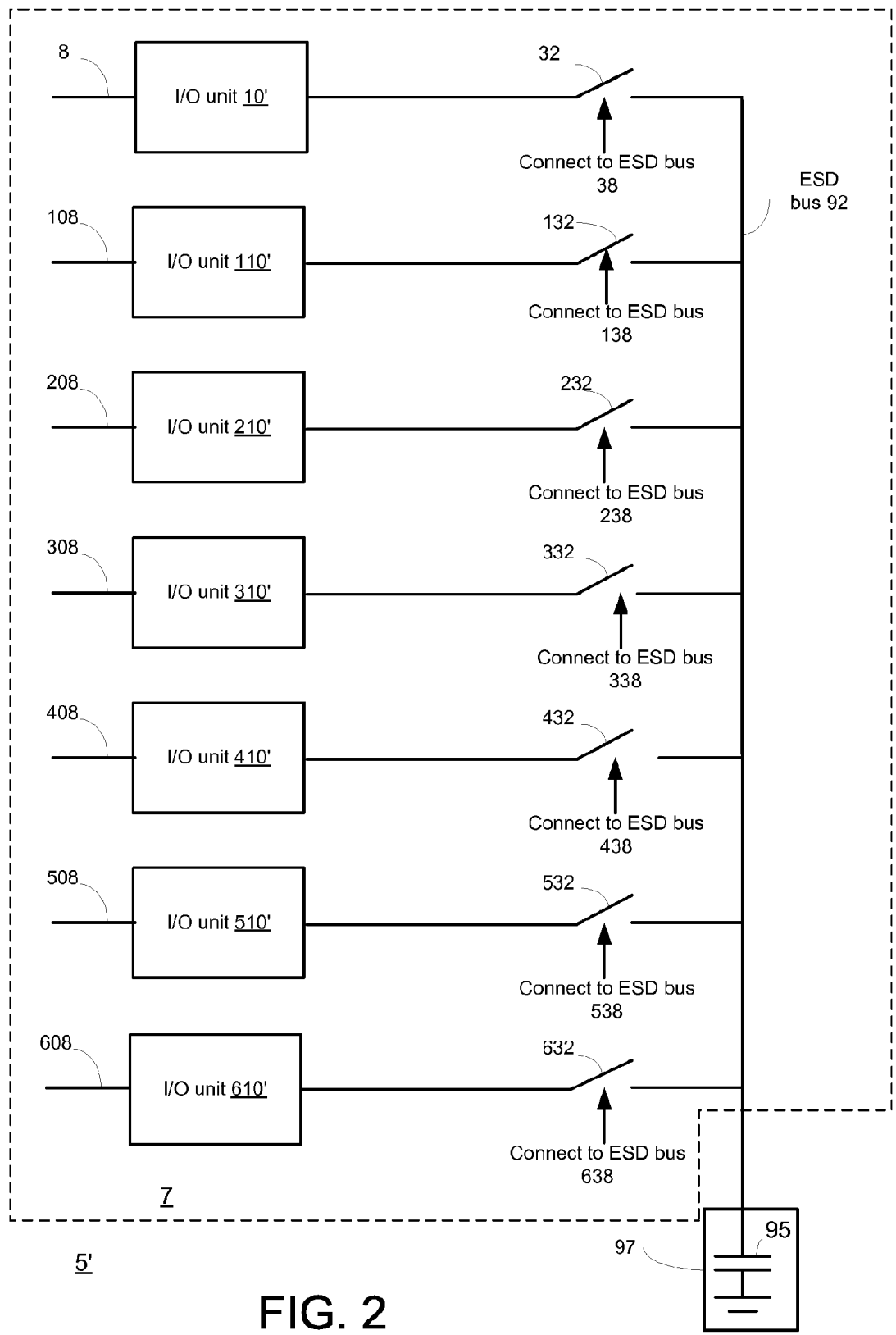
FIG. 2 illustrates a device, according to another embodiment of the invention.

Data lines 8, 108, 210, 308, 408, 508 and 608 connect IO circuits 10, 110, 210, 310, 410, 510 and 610 to additional circuits (not shown) that are usually internal circuits of an integrated circuit (such as integrated circuit 7 of FIG. 2).

It is noted that the switching circuitry can be controlled by multiple shared charge logic units but it can also be controlled by a centralized shared charge logic.

Figure 4:
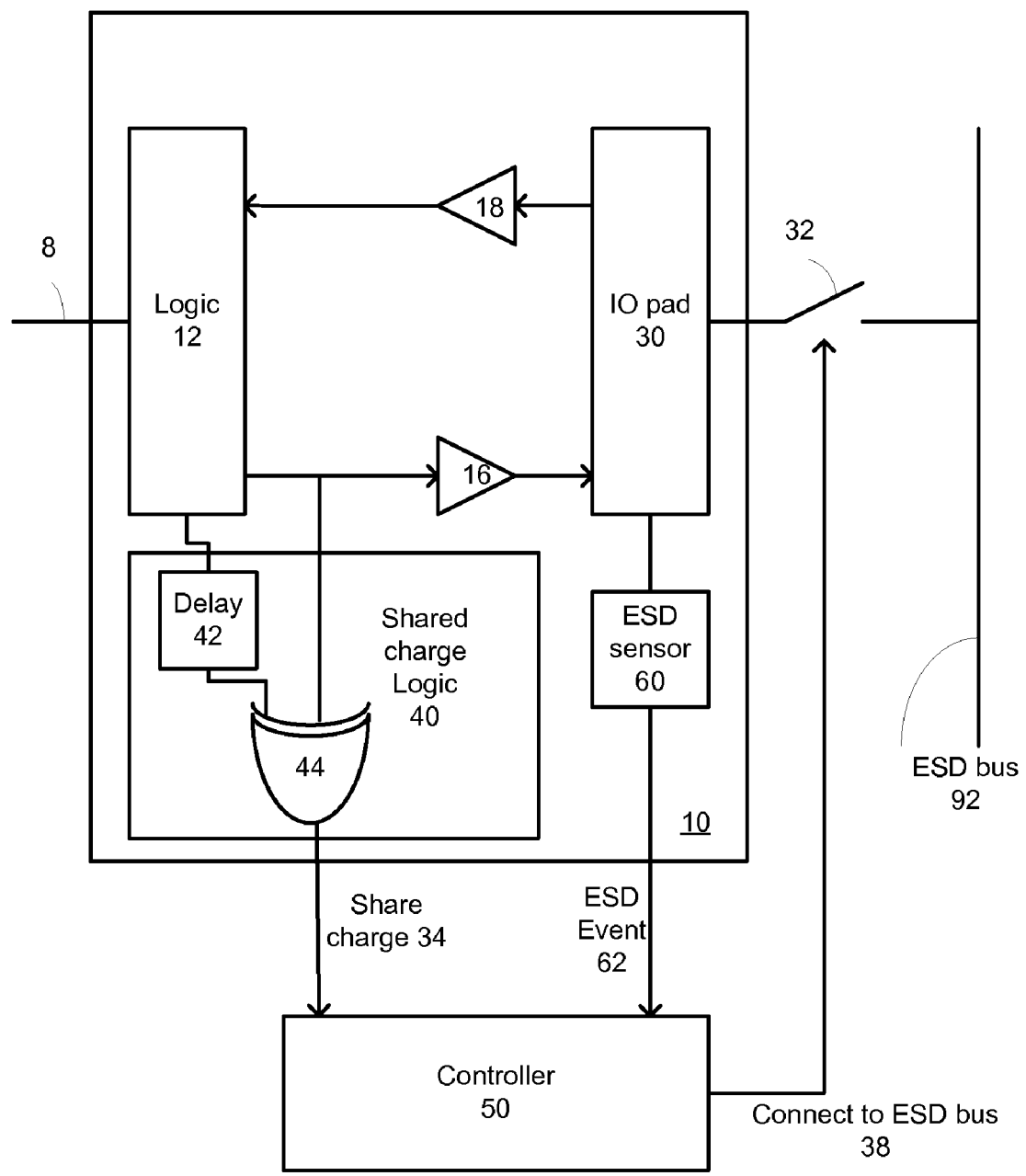
FIG. 4 illustrates an IO circuit, a switch, an ESD bus, a controller and a shared circuit, according to another embodiment of the invention.
Figure 5:
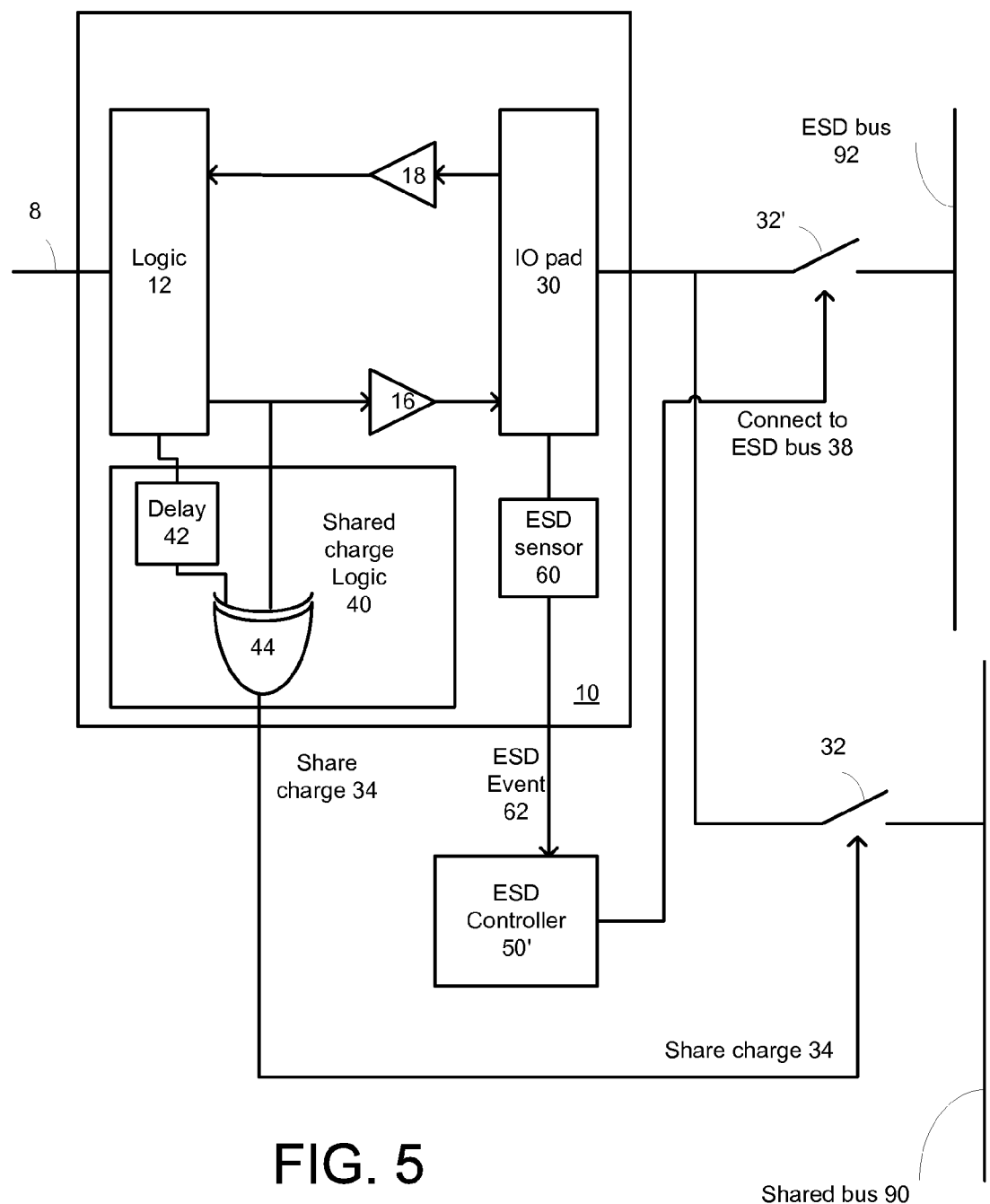
FIG. 5 illustrates an IO circuit, a switch, an ESD bus, a shared bus, a controller and a shared circuit, according to a further embodiment of the invention.

FIG. 4 and FIG. 5 illustrate multiple shared charge logics but other configuration of device 5 can be applied without departing from the spirit of the invention.

Each IO circuit includes an IO pad that can be connected to circuits or components that are located outside integrated circuit 7.

Shared circuit 97 is characterized by having a state that reflects multiple charge sharing cycles. A charge sharing cycle starts by a charge sharing phase during which one or more IO circuits are connected to shared circuit 97 in order to enable shared circuit 97 and the connected IO circuits to share one or more charges. IO circuits that are connected to shared circuit 97 and are initially charged to a high charge level charge shared circuit 97. IO circuits that are connected to shared circuit 97 and are initially at a low charge level discharge shared circuit 97.

Shared circuit 97 performs an averaging operation and statistically converges to a midway state that is midway between a high state and a low state.

Over time IO circuits change their state from a high state to a low state and vise verse. The number of IO circuits that change their state from a high state to a low state does not necessarily equal the number of other IO circuits that change their state from a low state to a high state. Nevertheless, during multiple IO cycles (and accordingly during multiple charge sharing cycles) these numbers converge toward each other.

By providing a shared circuit that is responsive to the states of multiple IO circuits over multiple IO cycles the system and method are less susceptible to temporal imbalances between the IO circuits.

The charge sharing cycle typically ends by a disconnection phase during which the IO circuits are disconnected from the shared circuit. This can allow the IO circuits to perform IO operations independently from each other.

Assuming that large numbers of IO circuits can be connected to shared circuit 97 and that shared circuit 97 can store charge reflecting multiple charge sharing cycles then the chances that the shared cycle 97 is set to a midway voltage level is relatively high, due to the averaging operation performed by shared circuit 97.

It is further noted that the shared circuit can also be charged or discharged to a certain charge level by another circuit that is not shown in FIG. 1-FIG. 2. Such a circuit can be used to initialize shared circuit 97.

FIG. 2 illustrates device 5', according to another embodiment of the invention.

Device 5' differs from device 5 of FIG. 1 by including ESD bus 92 that connects the IO circuits (via a switching circuitry) to shared circuit 97.

ESD stands for electrostatic discharge. ESD can damage integrated circuits. ESD can occur when a human touches an integrated circuit, when the integrated circuit contacts a machine or when the integrated circuit contacts a package in which the integrated circuit is packaged. Modern integrated circuits include ESD sensors and an ESD bus that provides a discharge path to charged generated due to ESD.

As will be illustrated in further details in relation to FIG. 4, device 5' also includes a decision logic (such as controller 50) that enables to connect one or more IO circuit to shared circuit 97 when an ESD event is detected. Those of skill in the art will appreciate that using ESD bus 92 to connect multiple IO circuits to shared circuit 97 can save die real estate and is highly area efficient. The efficiency is gained by using an existing bus (ESD bus 92) to implement a charge sharing scheme.

According to another embodiment of the invention (further illustrated in FIG. 5) shared bus 90 is used to share charges while ESD bus 92 is used to provide ESD protection.

ESD bus 92 is used to provide a charge path or a discharge path to IO circuits once an ESD event is detected. It is usually characterized by low impedance and high capacitance.

Figure 3:
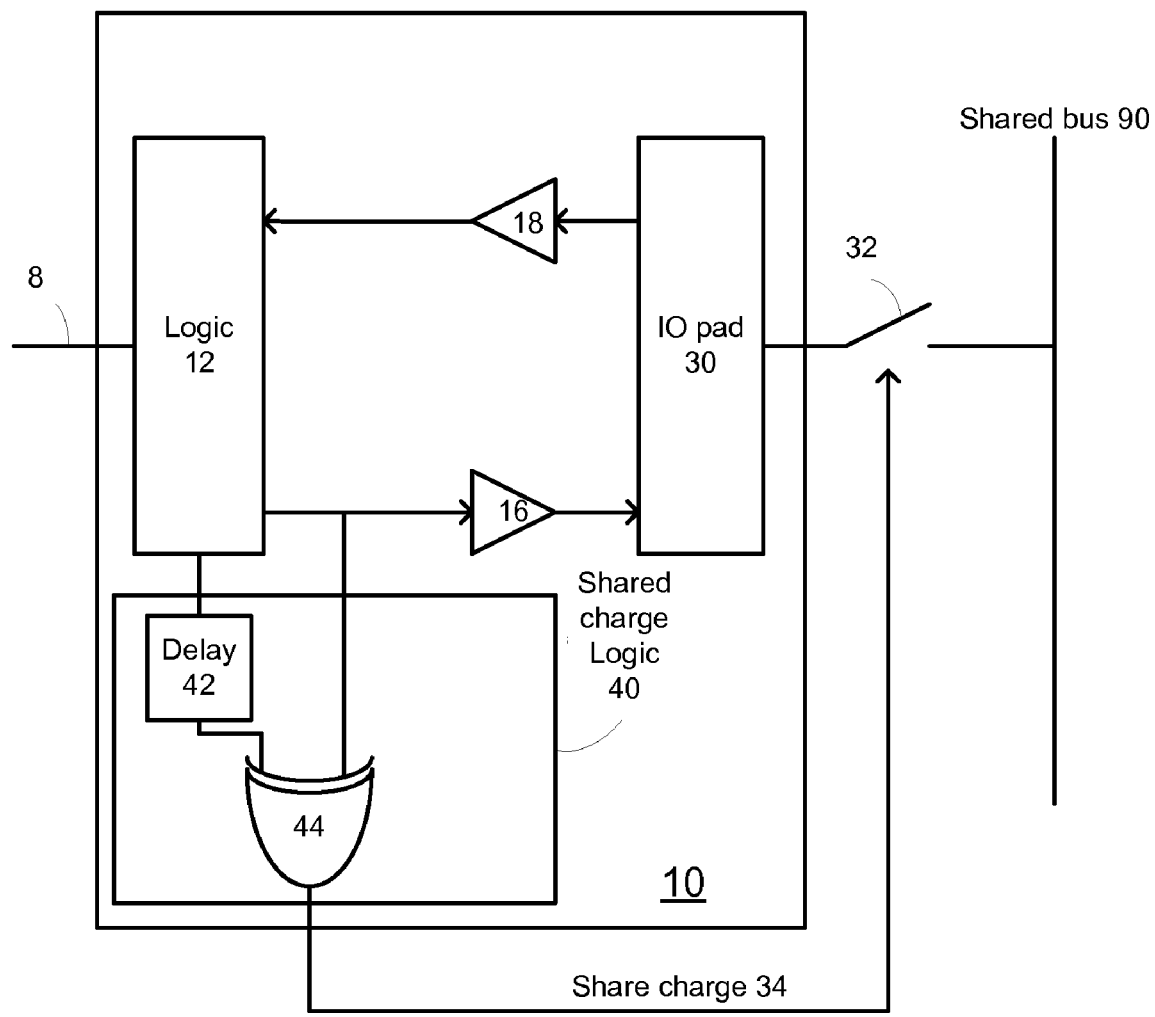
FIG. 3 illustrates an IO circuit, a switch, a shared bus and a shared circuit, according to an embodiment of the invention.

FIG. 3 illustrates IO circuit 10, switch 32, shared bus 90 and shared circuit 97, according to an embodiment of the invention.

IO circuit 10 can output data onto IO pad 30 and can also sense input data received by IO pad 30. It is assumed that IO circuit 10 acted as an output circuit during the last IO cycle and is intended to operate an output circuit during the next IO cycle. Accordingly, an expected change of the state of IO circuit 10 (between these consecutive IO cycles) can warrant a charge sharing.

If IO circuit 10 operates as an output circuit then logic 12 receives an input data signal (over input line 8) and sends it (during the IO cycle) to data driver 16 that in turn drives this input data onto IO pad 30. Charge sharing logic 40 can compare between the previous data written onto IO pad 30 and between the data to be written to IO pad 30 and if data values differ from each other then charge sharing logic 40 can send a "share charge" signal to switch 32 in order to connect IO circuit 10 to shared bus 90 during a charge sharing cycle.

Charge sharing logic 40 can include a delay unit ("delay") 42 that stores the data and XOR logic gate 44 that compares between the previous data (reflecting the previous state of IO pad 30) and the data that should be written to IO pad 30 (reflecting the expected state of IO pad 30). Delay unit 42 can be a memory cell, a flip-flop, a latch, an analog memory cell, and the like.

It is noted that the state of IO pad 30 can reflect a voltage level of IO pad 30, a charge level of IO pad, a current passing through of IO pad 30 and the like.

It is further noted that logic 12 can be located outside IO circuit 10, that charge sharing logic 40 can be located outside IO circuit 10 and that other decision mechanisms can be applied in order to determine which IO circuits will share charges.

FIG. 4 illustrates IO circuit 10', switch 32, ESD bus 92, controller 50 and shared circuit 95, according to an embodiment of the invention;

IO circuit 10 includes ESD sensor 60. ESD sensor 60 can detect when an ESD event occurs and send an indication (ESD event signal 62) to controller 50. Controller 50 also receives charge sharing signal 34 from charge sharing logic 40 and determines when to connect IO circuit 10 to shared ESD bus 92. IO circuit 10 can be connected to ESD bus 92 when an ESD event is detected (by ESD sensor 60 or by another ESD sensor) or during a charge sharing cycle.

Controller 50 sends a "connect to ESD bus" signal 38 to switch 32 to connect IO circuit 10 to ESD bus 92.

FIG. 5 illustrates IO circuit 10, switches 32 and 32', shared bus 90, ESD bus 92 and shared circuit 97, according to another embodiment of the invention.

FIG. 5 illustrates a scenario in which IO circuit 10 can be connected (via switch 32) to shared bus 90 for sharing charge and/or be connected to ESD bus 92 (by switch 32') in order to protect IO circuit 10 from ESD damage.

Figure 6:
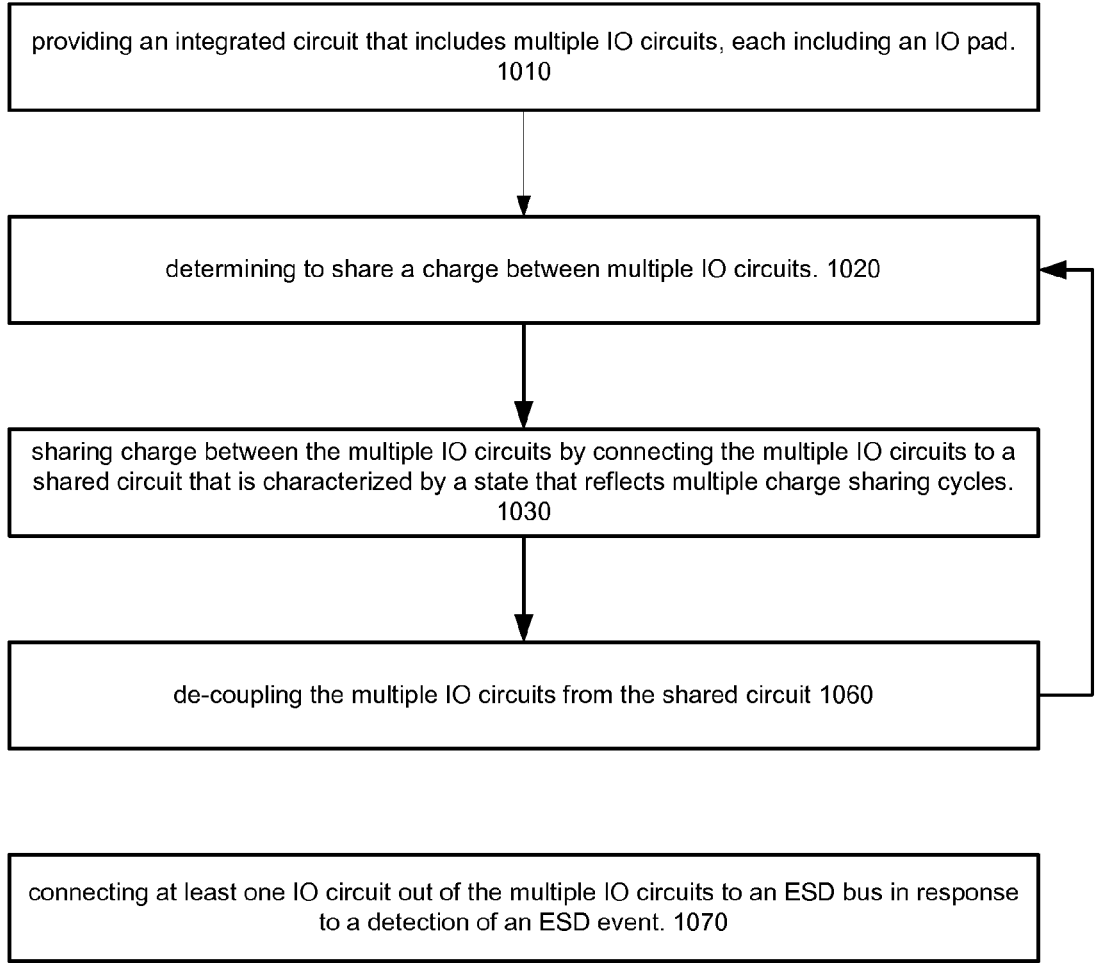
FIG. 6 is a flow chart illustrating a method for charge sharing according to an embodiment of the invention.

FIG. 6 is a flow chart illustrating method 1000 for charge sharing according to an embodiment of the invention.

Method 1000 starts by stage 1010 of providing an integrated circuit that includes multiple IO circuits, each including an IO pad.

Stage 1010 is followed by stage 1020 of determining to share a charge between multiple IO circuits.

Conveniently, stage 1020 includes selecting, out of a group of IO circuits multiple circuits that are expected to alter a state of their IO pads. Conveniently, stage 1020 includes selecting, out of a group of IO circuits that includes a large number of IO circuits, multiple IO circuits to participate in the charge sharing.

Stage 1020 is followed by stage 1030 of sharing charge between the multiple IO circuits by connecting the multiple IO circuits to a shared circuit that is characterized by a state that reflects multiple charge sharing cycles.

Conveniently, stage 1030 includes at least one of the following: (i) connecting the multiple IO circuits to a shared circuit that includes a large capacitor, (ii) connecting IO circuits that belong to an integrated circuit to a shared circuit that does not belong to the integrated circuit but is connected to the integrated circuit; (iii) connecting the multiple IO circuits to the shared circuit via an ESD bus; and (iv) connecting the multiple IO circuits to a shared circuit that is characterized by a state that reflects more than five chare sharing cycles.

Stage 1030 is followed by stage 1060 of de-coupling the multiple IO circuits from the shared circuit. Stage 1060 can be followed by performing IO operations by the IO circuits.

According to an embodiment of the invention method 100 also includes utilizing an ESD bus, although these stages are optional and method can include connecting the IO circuits to a shared bus that differs from the ESD bus. Accordingly, method 100 can include stage 1070 of connecting at least one IO circuit out of the multiple IO circuits in response to a detection of an ESD event. Stage 1070 can occur during an execution of another stage of method 1070 although this is not necessarily so.

While this embodiment has been described with a group of seven IO circuits and a single shared bus that is connected to a single shaped capacitor, it should be apparent that in alternative embodiments in accordance with this invention more capacitors, IO circuits and shared buses, at multiple locations within device or even outside the device may be used. Typically, larger numbers of IO circuits that can be connected to the same shared circuit can statistically improve the averaging operation executed by the shared circuit so that the shared circuit voltage level is midway between a high level and a low level.

Thus, a method and apparatus for sharing charge has been described. Although the present invention has been described with reference to specific exemplary embodiments, it will be evident that various modifications and changes may be made to these embodiments without departing from the broader spirit and scope the invention as set forth in the claims. Accordingly, the specification and drawings are to be regarded in an illustrative rather than a restrictive sense.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. A method for sharing charge between IO circuits, the method comprises:
   providing an integrated circuit that comprises multiple IO circuits, each IO circuit comprising:
   an IO pad; and
   a shared charge logic;
   determining to share a charge between a first IO circuit of the multiple IO circuits and a shared circuit; and
   selectively coupling a first IO pad associated with the first IO circuit to the shared circuit, wherein:
   the shared circuit is operable to share charge with the first IO pad;
   the shared circuit is characterized by a state that reflects multiple iterations of charge sharing operations; and
   in selectively coupling the first IO pad to the shared circuit, a first shared charge logic associated with the first IO circuit operates to select the first IO pad.

2. The method according to claim 1 wherein the shared circuit comprises capacitor.

3. The method according to claim 1 wherein the multiple IO circuits belong to an integrated circuit and wherein the shared circuit comprises a large capacitor that is coupled to the integrated circuit.

4. The method according to claim 1 wherein the stage of selectively coupling the first IO pad to the shared circuit comprises coupling the first IO pad to the shared circuit via an ESD bus.

5. The method according to claim 4 further comprising coupling the first IO pad in response to a detection of an ESD event.

6. The method according to claim 1 wherein the determining comprises determining by the first shared charge logic that the first IO circuit is expected to alter a state of the first IO pad.

7. The method according to claim 1 further comprising de-coupling the first IO pad from the shared circuit.

8. The method according to claim 1 wherein the shared circuit is characterized by a state that reflects more than five chare sharing cycles.

9. A device having sharing charge capabilities, the device comprises:
   a group of IO circuits, each IO circuit comprising:
   an IO pad;
   a shared charge logic adapted to determine to share a charge between the associated IO pad of the IO circuit and a shared circuit; and
   switching circuitry adapted to selectively couple the associated IO pad to the shared circuit so as to share charge between the IO pad and the shared circuit;
   wherein the shared circuit is characterized by a state that reflects multiple iterations of sharing charge operations.

10. The device according to claim 9 wherein the shared circuit is a capacitor.

11. The device according to claim 10 wherein the capacitor is coupled to an integrated circuit that comprises the multiple IO circuits.

12. The device according to claim 9 wherein the switching circuitry is coupled to the shared circuit via an ESD bus.

13. The device according to claim 12 further comprising a controller adapted to couple the two or more IO circuits to an ESD bus in response to a detection of an ESD event.

14. The device according to claim 9 wherein the shared charge logic is adapted to select the associated IO pad wherein the IO circuit is expected to alter a state of the associated IO pad.

15. The device according to claim 9 wherein the switching circuitry is adapted to de-coupling the IO pad from the shared circuit.

16. The device of claim 9 wherein the shared circuitry is characterized by a state that reflects more than five charge sharing cycles.

17. A method of claim 1 further comprising:
determining to share a charge between a second IO circuit of the multiple IO circuits, the first IO circuit, and the shared circuit; and
selectively coupling a second IO pad associated with the second IO circuit to the first IO pad and to the shared circuit, wherein a second shared charge logic associated with the second IO circuit operates to select the second IO circuit.

18. The method of claim 1, wherein each shared charge logic comprises:
a delay unit; and
an XOR logic gate;
wherein:
- a data state of the associated IO circuit is provided to an input of the delay unit, and to a first input of the XOR logic gate;
- an output of the delay unit is provided to a second input of the XOR logic gate; and
- an output of the XOR logic gate operates to select the associated IO circuit to be coupled to the shared circuit.

19. The device of claim 9, wherein each shared charge logic comprises:
a delay unit; and
an XOR logic gate;
wherein:
- a data state of the associated IO circuit is provided to an input of the delay unit, and to a first input of the XOR logic gate;
- an output of the delay unit is provided to a second input of the XOR logic gate; and
- an output of the XOR logic gate operates to select the associated IO circuit to be coupled to the shared circuit.

* * * * *

UNITED STATES PATENT AND TRADEMARK OFFICE
CERTIFICATE OF CORRECTION

| | | |
|---|---|---|
| PATENT NO. | : 7,940,084 B2 | |
| APPLICATION NO. | : 12/593519 | |
| DATED | : May 10, 2011 | |
| INVENTOR(S) | : Michael Priel et al. | |

It is certified that error appears in the above-identified patent and that said Letters Patent is hereby corrected as shown below:

Column 6, Line 15, please change "circuit comprises capacitor" to --circuit comprises a capacitor--

Column 6, Line 18, please change "a large capacitor" to --a capacitor--

Signed and Sealed this
Twenty-fifth Day of October, 2011

David J. Kappos
*Director of the United States Patent and Trademark Office*